(12) United States Patent
Ohki et al.

(10) Patent No.: US 9,747,968 B2
(45) Date of Patent: Aug. 29, 2017

(54) MAGNETIC RAM ARRAY ARCHITECTURE

(71) Applicants: RAYTHEON BBN TECHNOLOGIES CORP., Cambridge, MA (US); HYPRES, INC., Elmsford, NY (US)

(72) Inventors: Thomas Ohki, Arlington, MA (US); Oleg Mukhanov, Putnam Valley, NY (US); Alex Kirichenko, Pleasantville, NY (US)

(73) Assignees: Raytheon BBN Technologies Corp, Cambridge, MA (US); Hypres, Inc., Elmsford, NY (US)

( * ) Notice: Subject to any disclaimer, the term of this patent is extended or adjusted under 35 U.S.C. 154(b) by 0 days.

(21) Appl. No.: 15/356,117

(22) Filed: Nov. 18, 2016

(65) Prior Publication Data
US 2017/0069367 A1    Mar. 9, 2017

Related U.S. Application Data

(62) Division of application No. 14/812,812, filed on Jul. 29, 2015, now Pat. No. 9,552,862.

(60) Provisional application No. 62/030,333, filed on Jul. 29, 2014.

(51) Int. Cl.
*G11C 11/00* (2006.01)
*G11C 11/16* (2006.01)
*G11C 11/18* (2006.01)

(52) U.S. Cl.
CPC ...... *G11C 11/1675* (2013.01); *G11C 11/1655* (2013.01); *G11C 11/1657* (2013.01); *G11C 11/1659* (2013.01); *G11C 11/1673* (2013.01); *G11C 11/18* (2013.01)

(58) Field of Classification Search
CPC ............ G11C 11/1675; G11C 11/1673; G11C 11/1659; G11C 11/18; G11C 11/1655; G11C 11/1657
USPC ................................ 365/158, 148, 66, 55, 51
See application file for complete search history.

(56) References Cited

U.S. PATENT DOCUMENTS

| | | | | |
|---|---|---|---|---|
| 2009/0302394 A1* | 12/2009 | Fujita | .................. | H01L 27/0688 257/369 |
| 2013/0270508 A1* | 10/2013 | Li | ....................... | H01L 45/1206 257/4 |
| 2016/0035404 A1* | 2/2016 | Ohki | ................... | G11C 11/1659 365/158 |

OTHER PUBLICATIONS

Karl Berggren & Adam McCaughan, "Berggren, McCaughan devise nTron for new superconducting chips", 2014, MIT. see document at https://www.eecs.mit.edu/news-events/media/berggren-mccaughan-devise-ntron-new-superconducting-computer-chips.*

(Continued)

*Primary Examiner* — Viet Q Nguyen
(74) *Attorney, Agent, or Firm* — Lewis Roca Rothgerber Christie LLP

(57) ABSTRACT

A magnetic random access memory (MRAM) array including: a plurality of MRAM cells arranged in an array configuration, each comprising a first type nTron and a magnetic memory element; a wordline select circuit comprising of a second type nTron to drive a plurality of parallel wordlines; and a plurality of bitline select circuits, each comprising of said second type nTron for writing to and reading from a column of memory cells in the array and each capable of selecting a single MRAM cell for a memory read or write operation, wherein the second nTron has a higher current drive than the first nTron.

7 Claims, 6 Drawing Sheets

(56) References Cited

OTHER PUBLICATIONS

Larry Hardesty, "Superconducting circuits, simplified—New circuit design could unlock the power of experimental superconducting computer chips", Oct. 17, 2014, MIT News Office. See document at http://news.mit.edu/2014/cheaper-superconducting-computer-chips-1017.*

Adam McMacaughan & Karl Berggren, "A supperconducting-nanowire 3-terminal elelctronic device", 2014, MIT. See document at https://arxiv.org/ftp/arxiv/papers/1403/1403.6423.pdf.*

* cited by examiner

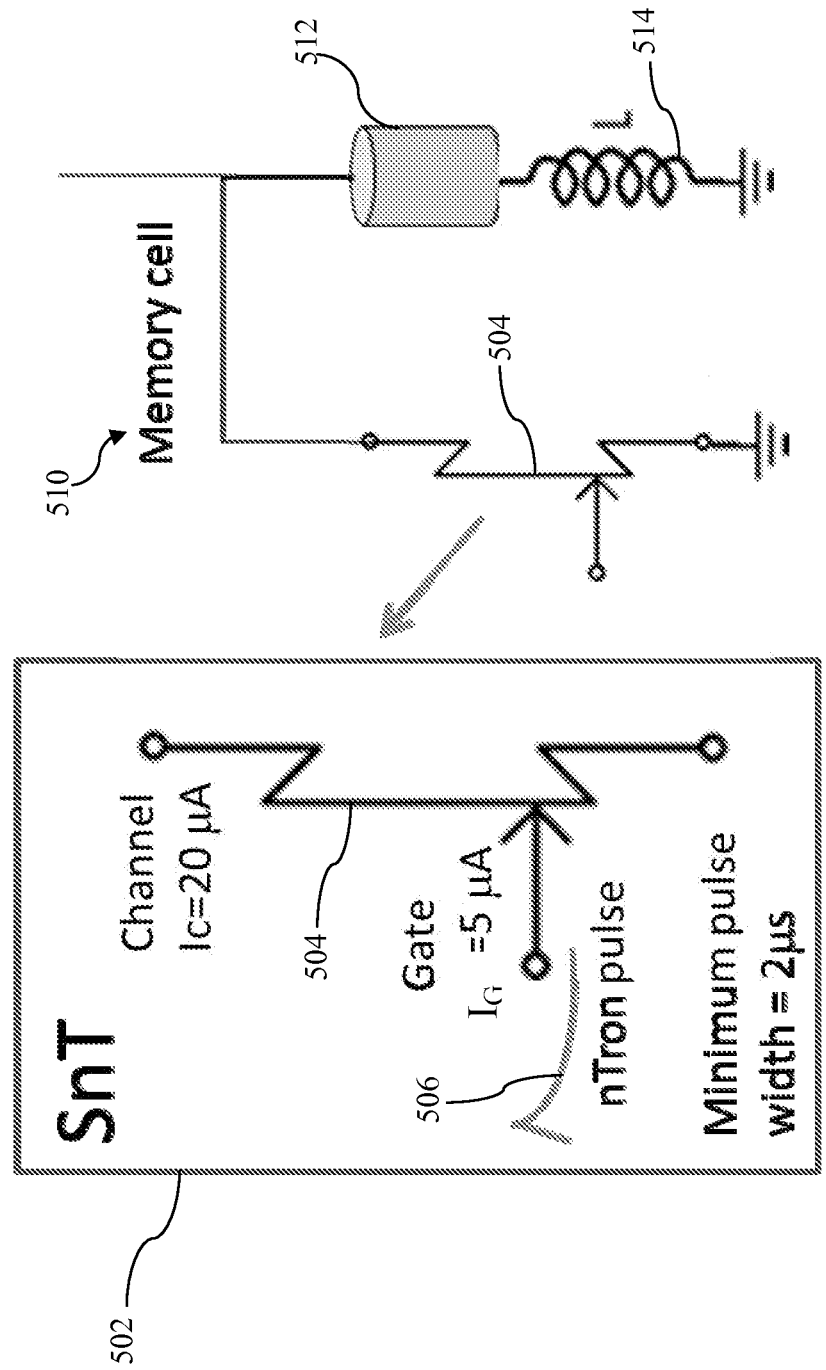

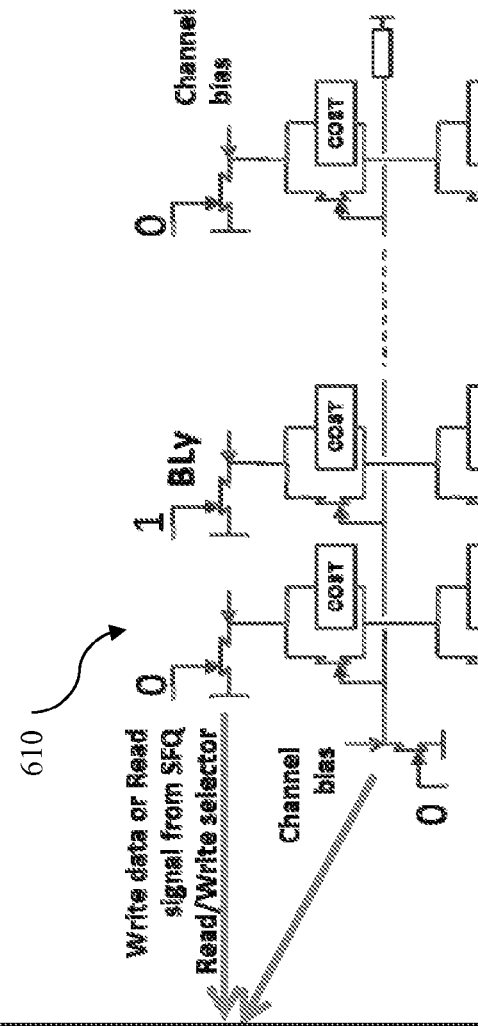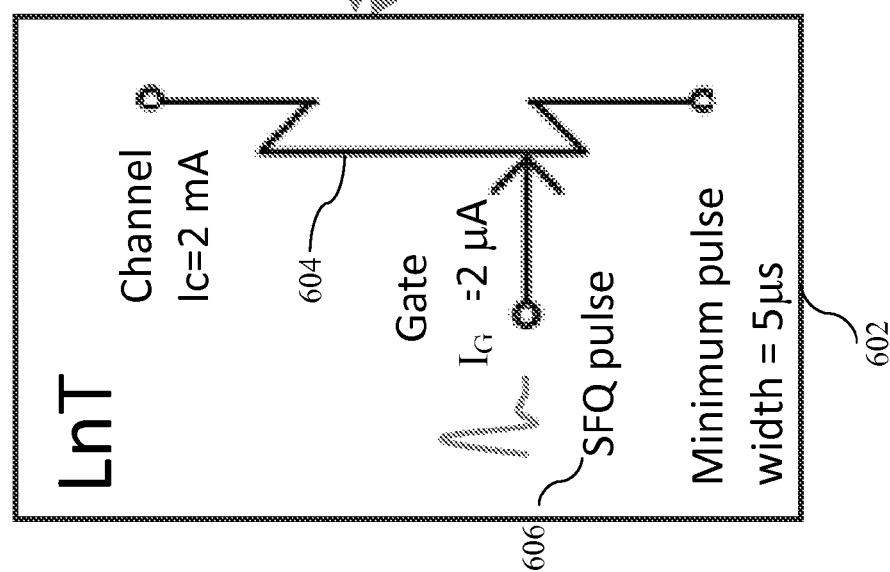
FIG. 6A
FIG. 6B

MAGNETIC RAM ARRAY ARCHITECTURE

CROSS-REFERENCE TO RELATED APPLICATIONS

This Patent Application is a divisional of U.S. patent application Ser. No. 14/812,812, filed Jul. 29, 2015, issued as U.S. Pat. No. 9,552,862 on Jan. 24, 2017, entitled "MAGNETIC RAM ARRAY ARCHITECTURE," which claims the benefits of U.S. Provisional Patent Application Ser. No. 62/030,333, filed on Jul. 29, 2014 and entitled "Memory Cells For Magnetic RAM," the entire content of which is hereby expressly incorporated by reference.

FIELD OF THE INVENTION

The present invention relates generally to magnetic memories; and more particularly to magnetic RAM array architectures.

BACKGROUND

Superconductivity is a phenomenon of zero electrical resistance and expulsion of magnetic fields occurring in certain materials when cooled below a characteristic critical temperature. Superconductors are used to build Josephson junctions which are the building blocks of superconducting digital electronics for superconductive computers, Josephson based sensors, such as superconducting quantum interference devices (SQUIDs), and quantum computing devices. Magnetic memories are also used in superconductive computers, where the environment is very cold and the traditional transistors (or pn-junctions) are not practical, because of the inefficiency of their intrinsic energy usage compared to Josephson Junction circuits or a magnetic memory circuit.

Magnetoresistive or Magnetic random-access memory (MRAM) is a non-volatile random-access memory (RAM) that stores data in magnetic storage elements. The magnetic storage elements are typically formed from two ferromagnetic plates separated by a thin insulating layer. Each of the ferromagnetic plates can hold a magnetization, with one of the two plates being a permanent magnet with a specific polarity, but the magnetization of other plate can be changed to match that of an external field to store data. This configuration is known as a spin valve and is a simplified structure for an MRAM cell. A magnetic RAM device can then be formed from a grid of such spin valve cells.

A spin valve is a device that includes two or more conducting magnetic materials, the electrical resistance of which can change depending on the relative alignment of the magnetization in the layers. The electrical resistance change is a result of the Giant Magnetoresistive effect, which is a quantum mechanical magnetoresistance effect in thin-film structures formed from alternating ferromagnetic and non-magnetic conductive layers. The magnetic layers of a spin valve device align directionally, for example, up or down, depending on an external magnetic field applied to the device. In a simple case, a spin valve device consists of a non-magnetic material sandwiched between two ferromagnets, one of which is fixed (pinned) by an antiferromagnet which acts to raise its magnetic coercivity and behaves as a "hard" layer, while the other is free (unpinned) and behaves as a "soft" layer. Due to the difference in coercivity, the soft layer changes polarity at lower applied magnetic field strength than the hard one. Upon application of a magnetic field of appropriate strength, the soft layer switches polarity, producing two distinct states consisting of a parallel, low-resistance state, and an antiparallel, high-resistance state.

A spin transfer torque (STT) is an effect that modifies the orientation of a magnetic layer in a spin valve device and can be changed using a spin-polarized current. STT uses spin-aligned ("polarized") electrons to directly torque a nearby layer. Specifically, if the electrons flowing into a layer have to change their spin, this will develop a torque that will be transferred to the nearby layer. This lowers the amount of current needed to write to the cells of an MRAM, making it similar to a read process of the MRAM.

Spin Hall Effect (SHE) is a transport phenomenon for the appearance of spin accumulation on the lateral surfaces of a sample carrying electric current. The opposing surface boundaries have spins of opposite sign. SHE can be used to electrically manipulate electron spins. For example, in combination with the electric stirring effect, SHE leads to spin polarization in a localized conducting region.

One of the substantial problems with current magnetic memory architectures is that they cannot perform "bit select," without using traditional transistors. Typically, one or more three terminal device such as a transistor is used at each memory cell location to individually select a bit or word in a memory array for read and writing operations. Another problem with magnetic memory array architectures is the relative high density of such array resulting in smaller memory capacity and/or larger packaging size. Moreover, most of the existing magnetic memory architectures are unscalable, electrically incompatible or energy inefficient.

SUMMARY

In some embodiments, the claimed invention utilizes a recently discovered three terminal superconducting device to efficiently perform both memory read and write operations.

In some embodiments, the present invention is a magnetic random access memory (MRAM) array including: a plurality of MRAM cells arranged in an array configuration, each comprising a first type nTron and a magnetic memory element; a wordline select circuit comprising of a second type nTron to drive a plurality of parallel wordlines; and a plurality of bitline select circuits, each comprising of said second type nTron for writing to and reading from a column of memory cells in the array and each capable of selecting a single MRAM cell for a memory read or write operation, wherein the second nTron has a higher current drive than the first nTron.

In some embodiments, the present invention is a method for writing to and reading from a magnetic random access memory (MRAM) array, each memory cell in the array comprising of a memory cell select nTron (SnT) and a memory element. The method includes: selecting a memory cell of the MRAM array by driving a word line and a bit line by a line select nTron (LnT), wherein the LnT has a higher current drive than the SnT; performing a memory write operation to a single MRAM cell by applying an LnT signal at a gate of the SnT of the single MRAM cell to switch the SnT to a resistive state; and performing a memory read operation from a single MRAM cell by applying an SFQ signal at a gate of the SnT of the single MRAM cell to switch the SnT to a resistive state, applying a current to the memory element smaller than a critical current of the memory element to keep the memory element at its current state while being read, and sensing the voltage at the memory element to determine the resistive state of the memory element.

In some embodiments, the magnetic memory element may be a Cryogenic Orthogonal Spin-Transfer (COST) device, which may include an inductance. In some embodiments, the magnetic memory element may be is a Cryogenic Spin Hall Effect (CSHE) device

BRIEF DESCRIPTION OF THE DRAWINGS

These and other features, aspects, and advantages of the present invention will become better understood with regard to the following description, appended claims, and accompanying drawings.

FIGS. 5A and 5B show an exemplary bit select nTron (SnT), according to some embodiments of the present invention.

FIGS. 6A and 6B depict an exemplary world line nTron (LnT), according to some embodiments of the present invention.

DETAILED DESCRIPTION

Figure 1:
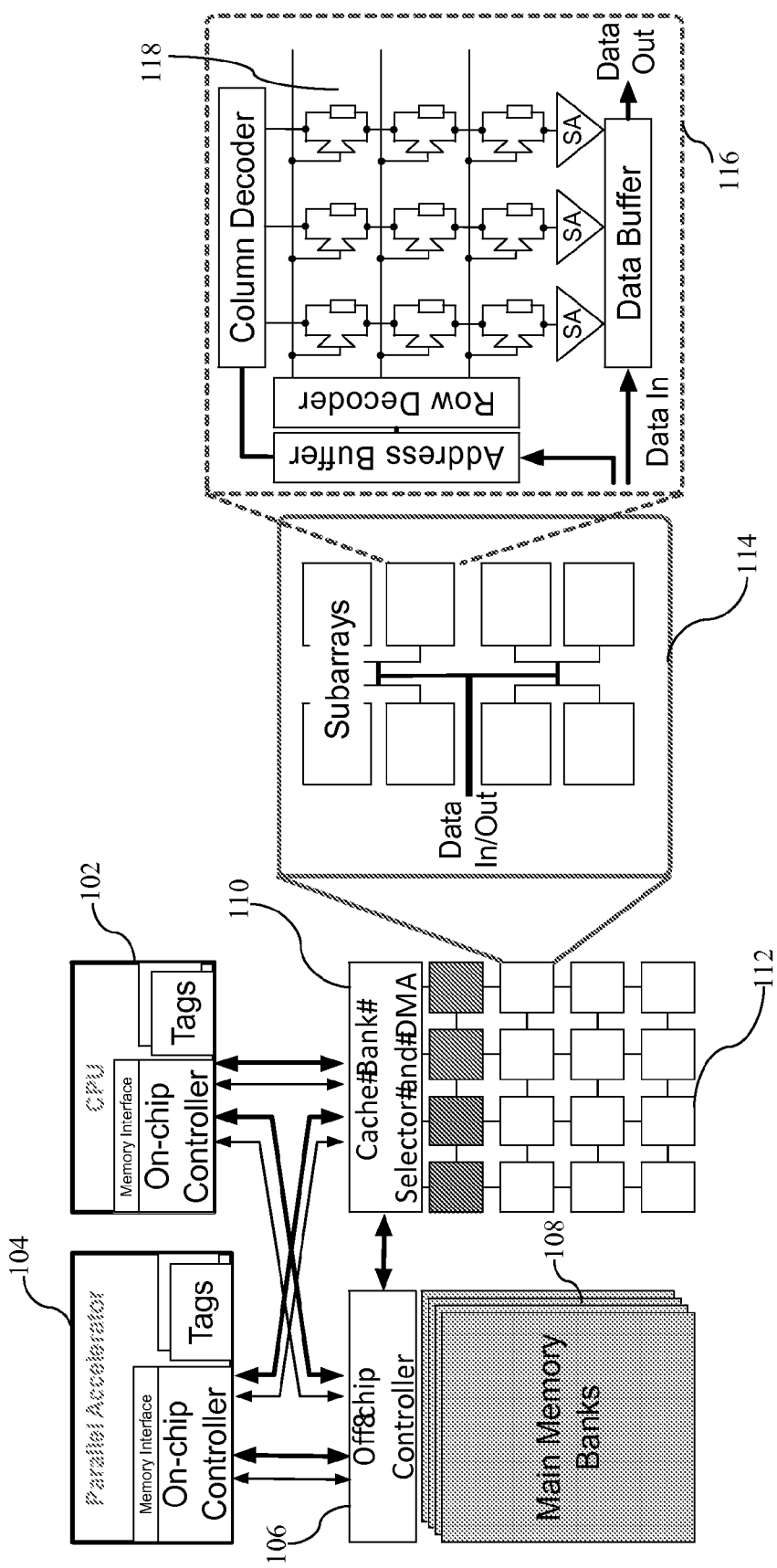
FIG. 1 is an Illustrative example of a memory subsystem, according to some embodiments of the present invention.

In some embodiments, the present invention is a Spin Transfer Energy-efficient multi-bit memory subsystem for a cryogenic heterogeneous (HSA) system capable of handling more than 10 GHz clock rates. The invention optimizes trade-offs of latency, power and speed comprised of circuit technology, based on Energy-Efficient Single Flux Quantum (ERSFQ) control logic, spin-transfer magnetic random-access-memory and 3-terminal superconducting logic. ERSFQ technology is an emerging technology and is described in more detail in "O. A. Mukhanov Energy-Efficient Single Flux Quantum Technology, IEEE Trans. Appl. Supercond. 21, no. 3, pp. 760-769, June 2011" ("[1]"), the entire contents of which is hereby incorporated by reference.

In some embodiments, the present invention uses an improved Cryogenic Orthogonal Spin-Transfer Magnetic RAM (COST-MRAM)) as the MRAM cells. In some embodiments, the present invention uses a new 3-terminal memory, Cryogenic Spin Hall Effect Spin-Transfer Magnetic RAM (CSHE ST-MRAM) as the MRAM cells that provide an additional benefit of easier state discrimination to facilitate faster and more efficient read operations. Additionally, the invention is compatible with two energy-efficient control logic technologies, ERSFQ and Reciprocal Quantum Logic (RQL). An exemplary low-power superconductor logic is described in more detail in "Quentin P. Herr, Anna Y. Herr, Oliver T. Oberg, and Alexander G. Ioannidis, Ultra-low-power superconductor logic, J. Appl. Phys. 109, 103903 (2011)" ("[2]"), the entire contents of which is hereby incorporated by reference.

In some embodiments, the present invention employs enhanced COST-MRAM or CSHE ST-MRAM (utilizing Josephson junctions) and integrates with both an ERSFQ controller logic and 3-terminal nanowire (nTron) circuits to build two types of memory cells and directly integrates them with superconductors. This enables greater densities and cross point architectures.

COST devices are relatively mature compared to CSHE devices, however, they are 2-terminal devices. CSHE can be three-terminal, where a low impedance circuit element can be used for the write operation and a separate high impedance element for the read operation. This makes the memory compatible with low impedance write elements of Single Flux Quantum (SFQ) circuits, while having large signal-to-noise ratios from the large device impedance. Typical 2-terminal devices do not share this duplicity and suffer from the tradeoff of write energy versus readout signal when only one channel is used for both operations, because if a low impedance terminal is needed for writing while a high impedance would result in greater SnT obviously both cannot be obtained from the same terminal.

COST and CSHE can be written to directly by SFQ circuits, when engineered for low impedances. Although this may not be true if the memory element is large impedance, since devices with large impedances have larger corresponding signals. Accordingly, in some embodiments, nTron 3-terminal circuits are used, which are large impedance devices and have shown to be able to drive currents in the order of several mA. The nTron logic can be utilized to charge bitlines or wordlines, for example, 64 elements deep. In addition, the 3-terminal nTron is analogous to inverse FETs and it can be used as a bit select element in a cross point architecture. In some embodiments, the logic switching of the array is performed via an SFQ pulse trigger.

In some embodiments, the present invention utilizes a known memory controller logic to control the operation of the magnetic RAM array by using a ERSFQ circuit, which is based on the RSFQ. ERSFQ circuits are major improvement upon the existing RSFQ circuits since there is zero static power dissipation which accounts for more than 90% of the power dissipated by conventional RSFQ. One major difference between ERSFQ and Reciprocal Quantum Logic (RQL) is that ERSFQ relies on digital clock distribution networks and DC power as opposed to RQL's global microwave biasing for power and clock. This presents few advantages. One advantage is that there is no limitation on clock frequencies for ERSFQ. This obviates the challenging engineering problem of distributing very high frequency microwave clocks. Moreover, clock signals for ERSFQ can be generated on chip with a DC bias, as opposed to relying on injecting high-power room temperature synthesized microwave signals. Furthermore, a majority of the energy saving of RQL is achieved by critical current reduction. This motivates the choice of ERSFQ since there is a tradeoff between write currents and speed for the MRAM devices. Ultimately, reduction of critical current reduces energy dissipation but at the cost of increased bit error rates and decreased performance of MRAM switching times.

FIG. 1 is an illustrative example of a memory subsystem for a quantum computer or a superconductive computer, according to some embodiments of the present invention. As shown, the SFQ/MRAM memory system comprises of a main memory bank 108, a CPU with associated control and logic 102, a memory controller 106, a memory bank selector and optional DMA 110, an optional cache hierarchy 112, and an optional parallel accelerator 104, implemented by SFQ or similar methods. A more detailed block diagram of the cache or the main memory is designated by item 114, which includes a plurality of MRAM subarrays, and data input/output and word/bit select lines.

Each MRAM subarray is depicted by item 116, which includes a plurality of MRAM memory cells, one or more known address buffers feeding a column decoder and a row decoder, data sensors (sense amplifiers) SA, and data buffers. Data buffers store the data and address bits that are sent to the decoders. Each of the row decoder and column decodes and sends an SFQ signal to a corresponding line driver nTron (LnT) at the array edge. For memory read operations, LnTs are selected and charge a line in half select mode. These bits in the word are then readout with a SA, for example SFQ comparator known in the art, and subsequently stored in a data buffer. The peripheral SFQ-based circuitry is well known in the art.

The MRAM memory cells comprise of enhanced COST-MRAM or CSHE ST-MRAM and 3-terminal nTron circuits to form two alternative types of memory cells and directly integrate them with the rest of the building block of a quantum computer or a superconductive computer.

The unique nature of timing in SFQ circuits has fundamentally different strengths than MOS-based VLSI circuits, and requires a novel approach to the design and optimization of the memory system. Also, supporting the high clock speed of an SFQ processor requires a novel approach to the organization of the memory hierarchy. According to the present invention, crosspoint memory arrays are deigned and organized into performance optimized memory blocks. An exemplary crosspoint memory structure 116 is depicted in FIG. 1.

Unlike the constant wordline voltage bias that is typical of CMOS memories, SFQ systems require that one or more transient pulses trigger a row access without significant signal attenuation. The problem of pulse degradation is thus exacerbated in crosspoint structures, where sneak currents leak through adjacent memory elements and reduce the readable signal amplitude. The present invention mitigates this problem with a methodology to size memory arrays and place Josephson junctions nTron within array rows and columns to restore the signal during a read.

Figures 2A, 2B:
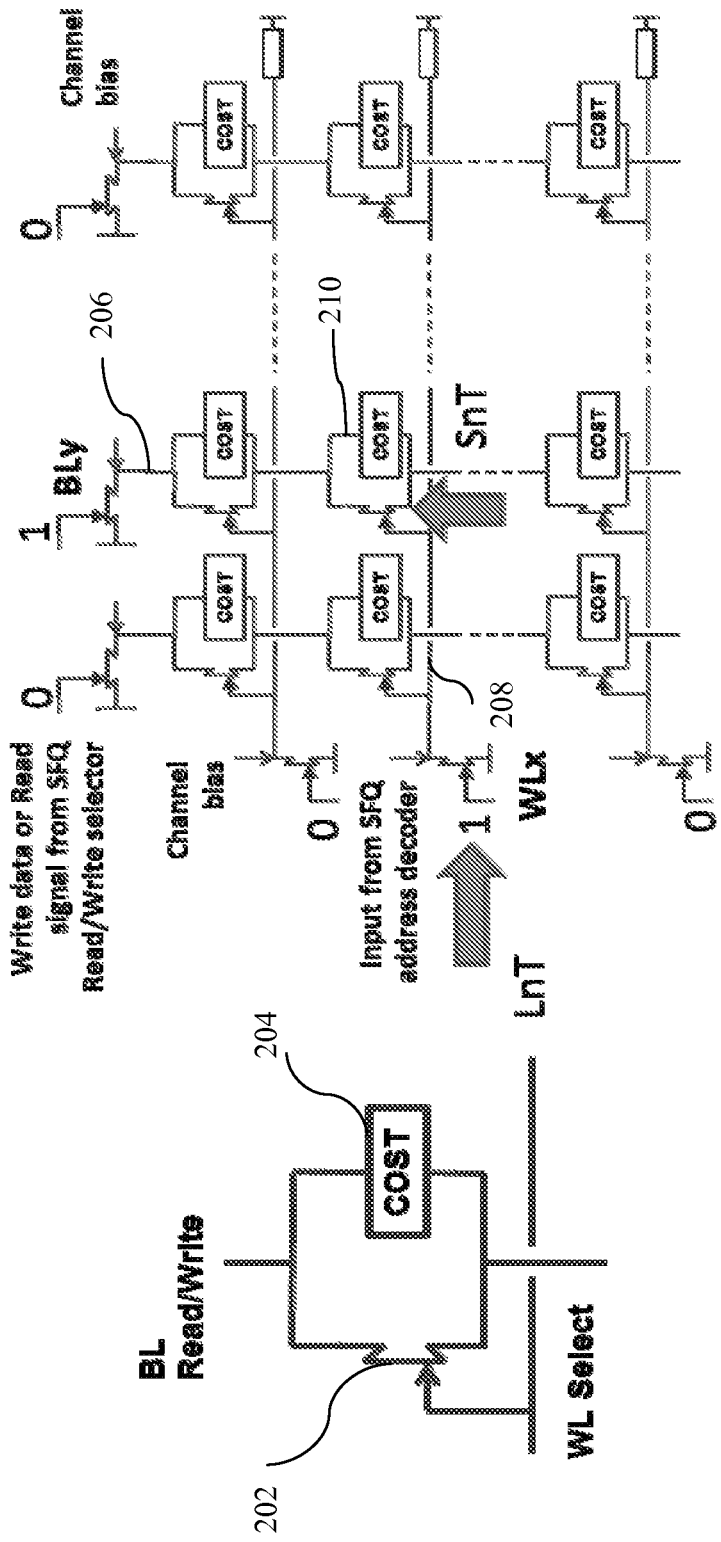
FIG. 2A shows a COST-nTron memory cell and FIG. 2B illustrates an array of such memory cells, according to some embodiments of the present invention.

FIG. 2A shows a COST-nTron memory cell and FIG. 2B illustrates an array of such memory cells, according to some embodiments of the present invention. As shown in FIG. 2A, the MRAM memory cell of these embodiments is based on a combination of Cryogenic Orthogonal Spin Transfer (COST) elements and nTron devices, also referred to as nanowire devices (NWDs). The nTron (NWD) acts as a cell selecting device functionally similar to a FET in a typical room temperature STT MRAM cell. Once the nTron switches from superconducting to resistive mode upon activation of a word line (WL) select current, the nTron redirects read or write current to the appropriate COST element. This design results in word selectable MRAM devices that can be written to and read from by the same bitline nTron.

Here, the word addressable write occurs on overlap of nTron impulse which loosens constraints on SFQ timing. SFQ pulse are very short (typically less than 2 ps) and thus synchronizing the pulses is difficult. The reason the constraint is loosened is that the nTron pulse is 1-2 ns in duration and therefore synchronization timing constraints are much easier to meet. In general, the wordline select (line driver) nTron (LnT) has different requirements than the bitline select nTron (SnT). For example, LnT needs to driver a number of (for example n) parallel SnT in the bitlines and therefore needs a larger bias and longer pulse duration to switch all of the SnTs in the line, and be capable of being triggered by an incoming data or address SFQ signal at the periphery. On the other hand, the SnT requires smaller channel current, smaller trigger current, and shorter pulse duration. Exemplary schematics of an LnT and a SnT are depicted in FIGS. 5A and 6A, and described below in more detail.

The circuit in FIG. 2A is a single cell of the COST/nTron, specifically an SnT. As shown, the circuit is comprised of an nTron 202 coupled in parallel with a COST device 204. Without a gate trigger current at the gate of nTron 202, current controlled by an SFQ circuit flows from top to bottom, the nTron 202 is therefore superconducting and thus all the current flows through the nTron. When a gate trigger is present, the nTron 202 is switched to the normal (resistive) state and current is then shunted to the COST device 204 to switch the (magnetic) state of the COST device 204. The binary (magnetic) state represents a binary data in the COST device 204.

FIG. 2B shows an extension of the single memory cell of FIG. 2A to a memory array that is control by LnT type nTrons. A sample write operation is shown where the bitline 206 and the word line 208 (shown by the arrow) are activated for the memory cell 210. When an address arrives (logical "1") at the WLx, the LnT is triggered and charges that word line. Simultaneously, data from the bitline Bly arrives at the same cells in the selected word. The cell operation as described before then results in either a write (high current) or no operation (low current). That is, is there is sufficient current (logical "1") the state of the magnetic memory cell is switched. However, when there is not sufficient current, the state stays the same.

Figures 3A, 3B:
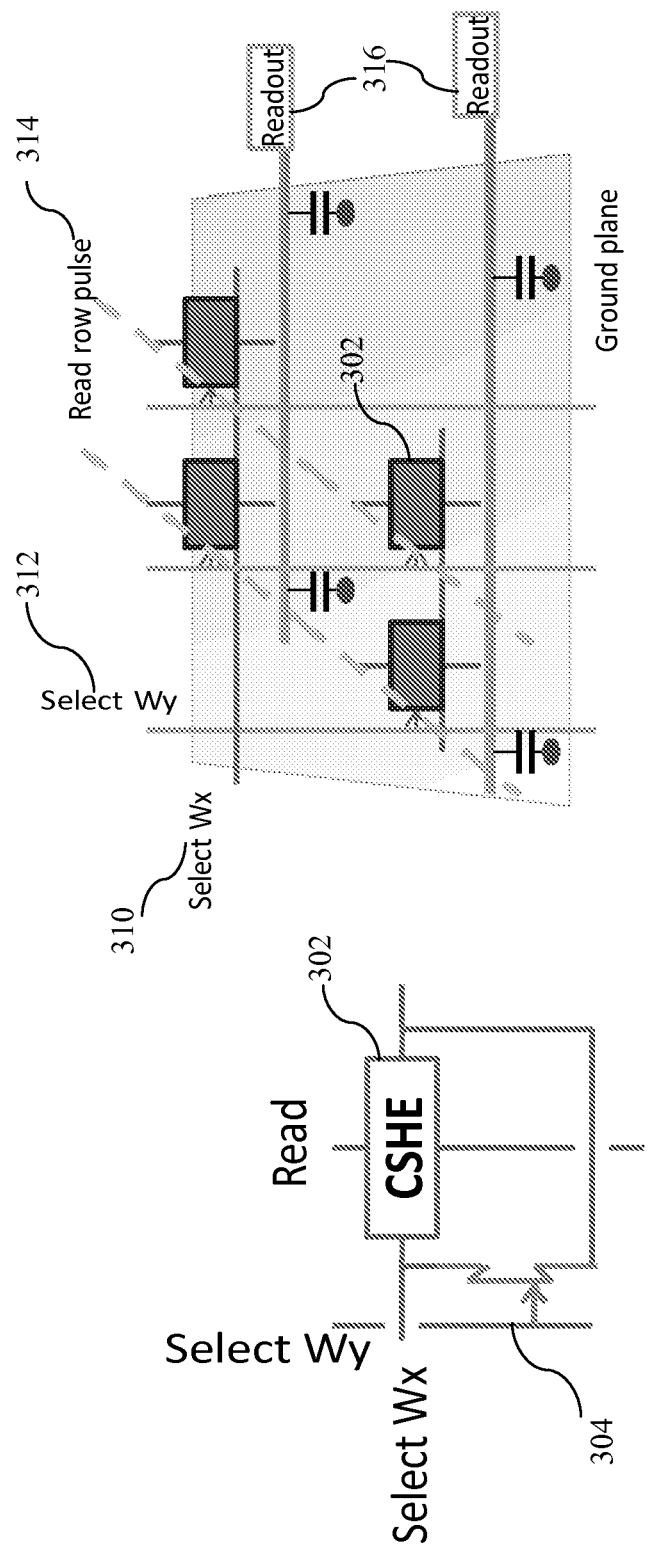
FIG. 3A depicts a CSHE-nTron memory cell and FIG. 3B shows an array of such memory cells, according to some embodiments of the present invention.

FIG. 3A depicts a CSHE-nTron memory cell and FIG. 3B shows an array of such memory cells, according to some embodiments of the present invention. The memory element based on Cryogenic Spin Hall Effect (CSHE) has low write resistance and exhibits high magneto resistance. The CSHE is a three-terminal device that decouples read and write operations. The invention employs a new nTron-based switch as a selection element for write operation. The read operation requires separate grid of impedance-matched lines for transmitting voltage pulses along a row line, while sensing their responses (i.e., their resistance) along all columns, thus providing word-access memory readout. Here, the nTron-based cell selector behaves similar to a FET in a conventional MRAM.

The circuit in FIG. 3A is a single cell of the CSHE/nTron, specifically an SnT, which comprises of an nTron 302 in parallel with a CSHE device 304. If current, controlled by the an SFQ circuit flows from the select Wx line 306, the nTron is superconducting without a gate trigger on select Wy line 308 and all the current flows through the nTron. If a gate trigger is present, the nTron 302 is switched to the normal state and current is shunted to the CSHE device 304 to switch its state for a write operation. The state of the CSHE device 304 is then read by measuring its resistance by applying the sufficiently current (low enough not to change the state while it is being read) and measuring the voltage.

FIG. 3B shows an extension of the single memory cell to an array that would be controlled by similar LnT type nTrons as described previously. Simultaneously, data from Wy arrives at the same cells in the selected word line Wx 306, and subsequently results in a memory write operation. That is, when the device has a current applied beyond its critical switching current, the state of the device changes from high resistance to low resistance. A memory read operation is performed by applying a Read row pulse 310, i.e., sufficiently low not to charge the state of the memory cell. The voltage drop across the Magnetic Tunnel Junction (MTJ) of the memory cell 314 is then readout by a known sensing circuit (not shown), for example, a known SFQ comparator.

This creates a component of a memory subsystem that seamlessly fits into the larger hierarchy of an MRAM array.

Figure 4:
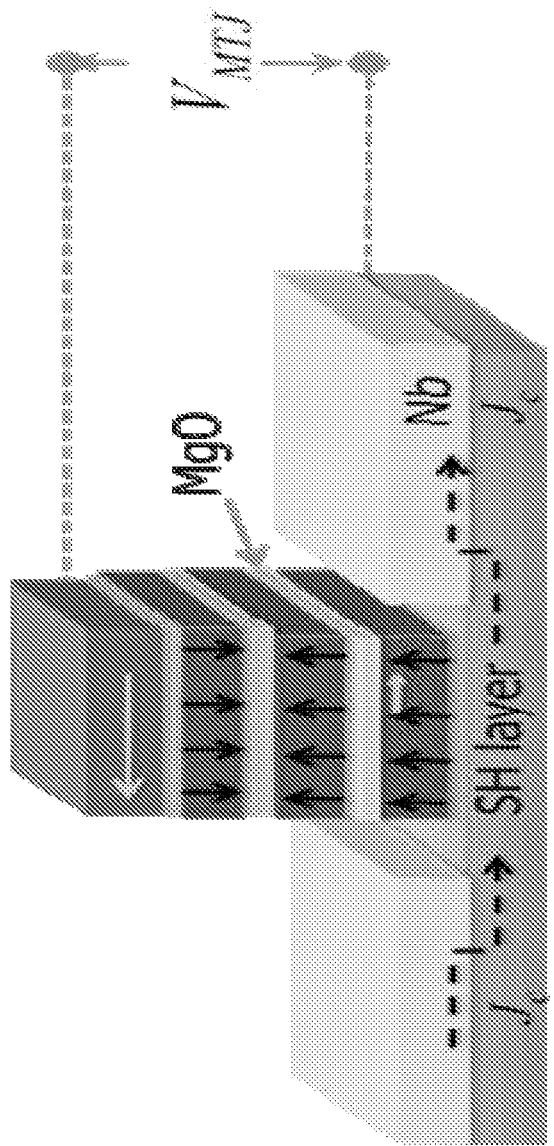
FIG. 4 illustrates an exemplary schematic of a PMA CSHE device, according to some embodiments of the present invention.

FIG. 4 illustrates an exemplary schematic of a Perpendicularly Magnetized (PM) CSHE device, according to some embodiments of the present invention. As shown, the PM CSHE device utilizes a Magnetic Tunnel Junction (MTJ) with a synthetic anti-ferromagnet fixed layer above the MgO, and capped by an in-plane magnetic bias layer. The illustrated device has Nb superconducting contacts that connect to the spin Hall metal layer providing a low resistance write channel. The spin Hall metal then propagates opposing spin currents to the upper and lower boundary of the metal. This spin polarized current then exerts a torque on the bottom free layer in red. The magnetic tunnel barrier is formed by the MgO between the ferromagnetic red layers. Black arrows represent the magnetization of the layer. Depending on the orientation of the magnetization in the free layer, a different voltage across the junction $V_{MTJ}$ is measured.

FIGS. 5A and 5B show an exemplary bit select nTron (SnT), according to some embodiments of the present invention. As shown in FIG. 5A, an SnT comprises of a single nTron 504 with a channel critical current (Ic) of, for example, 20 µA and a gate current $I_G$ of, for example, 5 µA. The gate of the nTron 504 is configured to be triggered by an nTron pulse 506 from an LnT (described below). The memory cell 510 in FIG. 5B is composed of an SnT 504 and a COST device 512. An additional inductance 514 (e.g., an inductor L) may be added to reset the nTron to the superconducting state. The value of the inductor L is chosen based on the RL time constant of the COST device 512 to yield a 1-2 ns reset. As shown, current is applied to the memory cell and is shunted by the nTon, when in the superconducting state, while no current passes through the MRAM. When the nTron receives an SFQ pulse at the gate, it switches the channel to a high resistance state and then diverts the current to the MRAM COST device 512. Once the MRAM's critical switching current is exceeded, it changes its magnetoresistance state from high to low resistance, which is an indication of the binary data stored in the COST device. This change in resistance (state) is readout out by applying a low select current to the array while the nTron is in the high resistance state. The current applied to the MRAM COST device 512 in a read operation needs to be sufficiently lower than the MRAM's critical switching current so that the applied current does not change the state of the memory cell while it is being read from. In some embodiments, the state of the MRAM COST device 512 (that is a binary 1 or a binary 0) is read by applying a current (low select or half select current) to the memory cell and reading the voltage at its base. The voltage would be an indication of the resistance of the memory cell, which then indicates which (resistive) state the memory cell is in. In some embodiments, the state of the MRAM COST device 512 (that is a binary 1 or a binary 0) is read by applying a voltage (low select or half select voltage) to the memory cell and reading the current at its base to determine the resistance of the memory cell.

FIGS. 6A and 6B depict an exemplary world line nTron (LnT), according to some embodiments of the present invention. As described above, since the LnTs drive a line across the memory array, they have a higher (current) driving capability than the SnTs. As shown in FIG. 6A, an LnT 602 includes a single nTron 604 with a channel critical current (Ic) of, for example, 2 mA (higher that the Ic current of the SnT in FIG. 5A) and a gate current $I_G$ of, for example, 2 µA.

The gate is configured to be triggered by an SFQ pulse from a known SFQ address decoder or data bitline circuit (not shown). The channel current Ic is optimized to drive a linear array of bit select nTrons (SnTs). In some embodiments, the linear array comprises of a 64 bit word, that is, the LnT is capable of driving 64 SnTs. The memory array 610 in FIG. 6B shows a configuration of the LnT devices used for both word and bit write and read operations. As shown, current is applied to the nTron channel by an SFQ circuit. When in the superconducting state, the nTron shunts this current to ground while no current passes through the SnT array. When the nTron receives an SFQ pulse at the gate, it switches the channel to a high resistance state and then diverts the current to the SnT array for both word and bit write and read operations. The read and write operations for the memory cells are described above with respect to FIGS. 2 and 5.

It will be recognized by those skilled in the art that various modifications may be made to the illustrated and other embodiments of the invention described above, without departing from the broad inventive step thereof. It will be understood therefore that the invention is not limited to the particular embodiments or arrangements disclosed, but is rather intended to cover any changes, adaptations or modifications which are within the scope and spirit of the invention as defined by the appended claims.

The invention claimed is:

1. A method for writing to and reading from a magnetic random access memory (MRAM) array, each memory cell in the array comprising of a memory cell select nTron (SnT) and a memory element, the method comprising:

selecting a memory cell of the MRAM array by driving a word line and a bit line by a line select nTron (LnT), wherein the LnT has a higher current drive than the SnT;

performing a memory write operation to a single MRAM cell by applying an nTron signal at a gate of the SnT of the single MRAM cell to switch the SnT to a resistive state; and performing a memory read operation from the single MRAM cell by applying a Single Flux Quantum (SFQ) signal at a gate of the SnT of the single MRAM cell to switch the SnT to a resistive state, applying a current to the memory element smaller than a critical current of the memory element to keep the memory element at its current state while being read, and sensing the voltage at the memory element to determine the resistive state of the memory element.

2. The method of claim 1, wherein the memory element is a Cryogenic Orthogonal Spin-Transfer (COST) device.

3. The method of claim 2, wherein the each of the memory cells further comprises an inductance.

4. The method of claim 1, wherein the memory element is a Cryogenic Spin Hall Effect (CSHE) device.

5. The method of claim 1, wherein the line select nTron is capable of driving a linear array of 64 memory cell select nTrons for a memory word of 64 bits wide.

6. The method of claim 1, further comprising reading the state of said each MRAM cell using the determined resistive state of the memory element.

7. The method of claim 1, further comprising keeping the memory element at its current state while being read by applying a current to the memory element smaller than a critical current of the memory element, during a memory read operation.

* * * * *